(12) United States Patent
Tuominen et al.

(10) Patent No.: US 7,609,527 B2
(45) Date of Patent: Oct. 27, 2009

(54) ELECTRONIC MODULE

(75) Inventors: Risto Tuominen, Helsinki (FI); Petteri Palm, Helsinki (FI)

(73) Assignee: Imbera Electronics OY, Espoo (FI)

( * ) Notice: Subject to any disclaimer, the term of this patent is extended or adjusted under 35 U.S.C. 154(b) by 0 days.

(21) Appl. No.: 11/907,795

(22) Filed: Oct. 17, 2007

(65) Prior Publication Data

US 2008/0043441 A1 Feb. 21, 2008

Related U.S. Application Data

(63) Continuation of application No. 10/546,820, filed on Aug. 25, 2005, now Pat. No. 7,299,546.

(51) Int. Cl.
*H05K 1/18* (2006.01)

(52) U.S. Cl. .................. 361/761; 361/760; 361/763; 361/764; 361/767; 361/768

(58) Field of Classification Search .......... 361/760, 361/763, 764, 767, 768, 790–795, 704, 710, 361/719, 728, 729, 735, 800, 808, 761
See application file for complete search history.

(56) References Cited

U.S. PATENT DOCUMENTS

| | | | |
|---|---|---|---|
| 3,480,836 | A | 11/1969 | Aronstein |
| 3,931,922 | A | 1/1976 | Jackson et al. |
| 3,942,245 | A | 3/1976 | Jackson et al. |
| 4,102,039 | A | 7/1978 | Henrickson et al. |
| 4,246,595 | A | 1/1981 | Noyori et al. |
| 4,835,846 | A | 6/1989 | Juan et al. |
| 5,042,145 | A | 8/1991 | Boucquet et al. |
| 6,038,133 | A | 3/2000 | Nakatani et al. |
| 6,154,366 | A | 11/2000 | Ma et al. |
| 6,271,469 | B1 | 8/2001 | Ma et al. |
| 6,489,685 | B2 | 12/2002 | Asahi et al. |
| 6,538,210 | B2 | 3/2003 | Sugaya et al. |
| 6,600,231 | B2 | 7/2003 | Tominaga et al. |
| 6,664,130 | B2 | 12/2003 | Akram |
| 2001/0037896 | A1 * | 11/2001 | Asai et al. ............... 174/255 |
| 2002/0117743 | A1 | 8/2002 | Nakatani et al. |
| 2003/0068852 | A1 | 4/2003 | Towle et al. |
| 2003/0090883 | A1 * | 5/2003 | Asahi et al. ............. 361/761 |
| 2003/0121692 | A1 * | 7/2003 | Kato et al. .............. 174/68.1 |
| 2003/0137045 | A1 | 7/2003 | Sugaya et al. |

(Continued)

FOREIGN PATENT DOCUMENTS

DE 44 24 396 A1 1/1996

(Continued)

*Primary Examiner*—Dean A. Reichard
*Assistant Examiner*—Hoa C Nguyen
(74) *Attorney, Agent, or Firm*—Birch, Stewart, Kolasch & Birch LLP

(57) ABSTRACT

An electronic module in which an installation base is used, which includes an insulating-material layer (1) and a conductive layer on the surface of the insulating-material layer. The conductive layer also covers the installation cavity of a component (6). The component (6) is set in the installation cavity, in such a way that the contact zones face towards the conductive layer and electrical contacts are formed between the contact zones of the component (6) and the conductive layer. After this, conductive patterns (14) are formed from the conductive layer, to which the component (6) is attached.

27 Claims, 8 Drawing Sheets

U.S. PATENT DOCUMENTS

| | | | |
|---|---|---|---|
| 2003/0159849 A1* | 8/2003 | Wermelinger | 174/156 |
| 2003/0188885 A1* | 10/2003 | Niinobe et al. | 174/73.1 |
| 2004/0026112 A1* | 2/2004 | Goldsworthy et al. | 174/106 R |
| 2005/0000729 A1 | 1/2005 | Iijima et al. | |

FOREIGN PATENT DOCUMENTS

| | | | |
|---|---|---|---|
| GB | 2204184 A | 11/1988 |
| JP | 2001-53447 A | 2/2001 |
| JP | 2001-053447 A | 2/2001 |
| WO | WO-96/02042 A1 | 1/1996 |

* cited by examiner

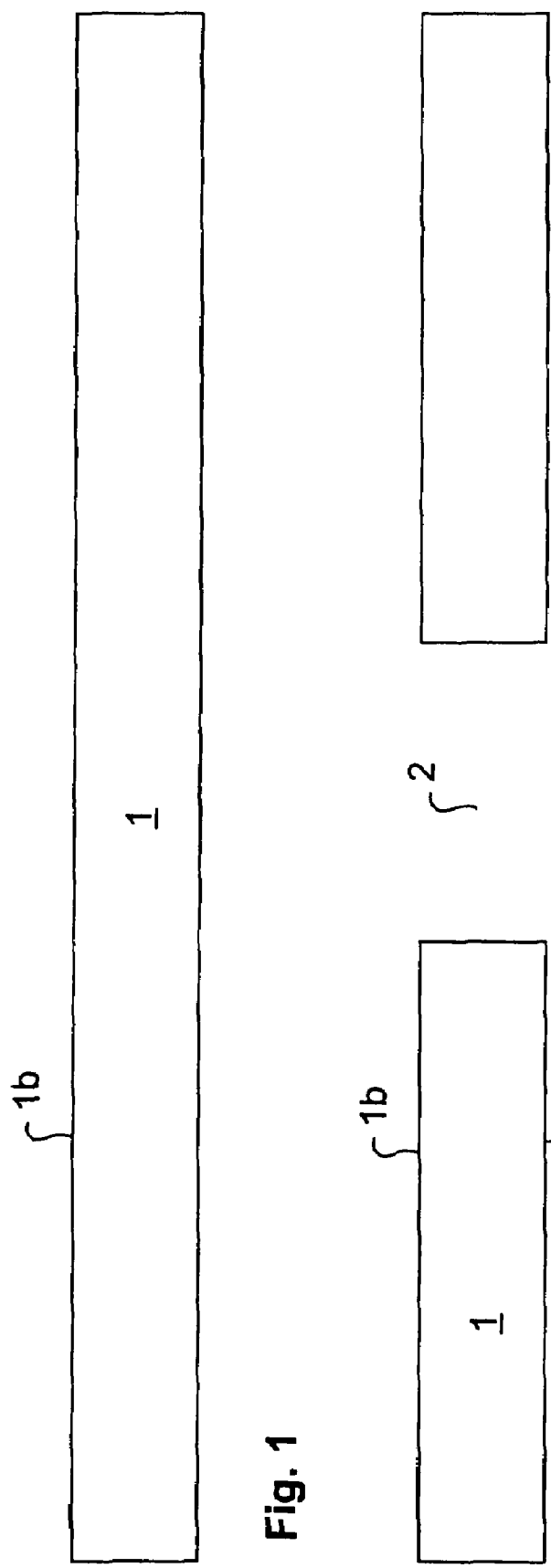

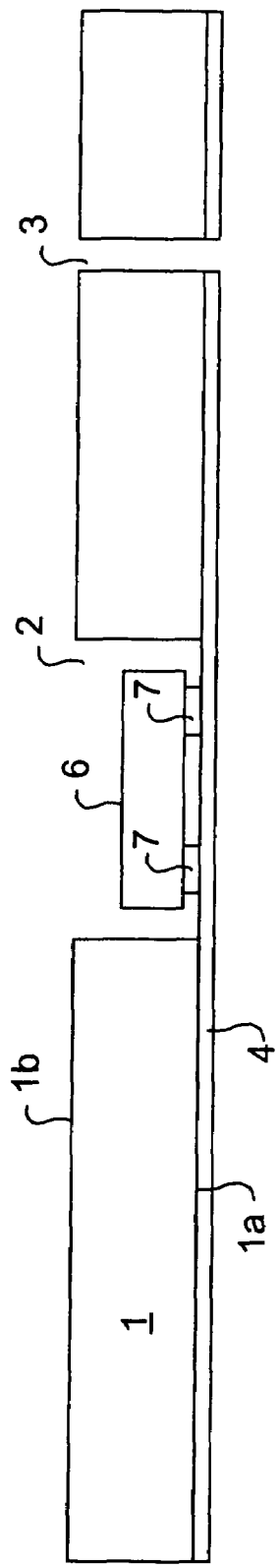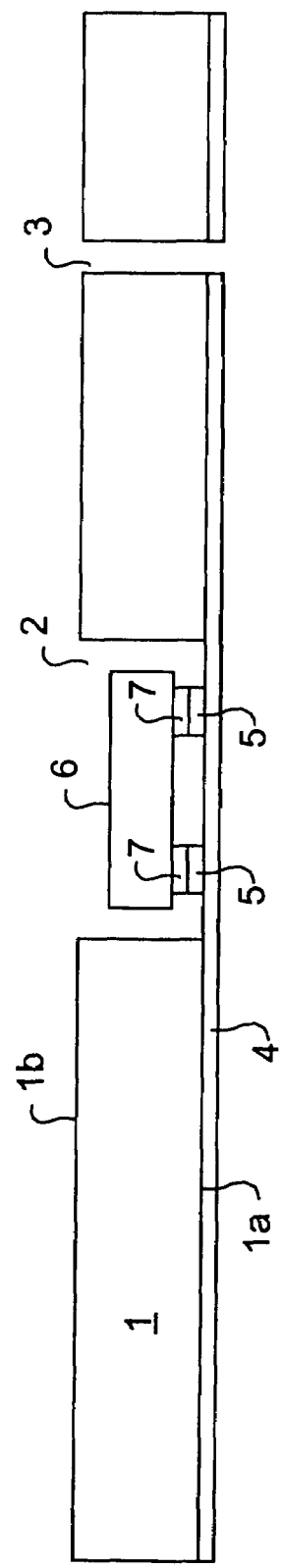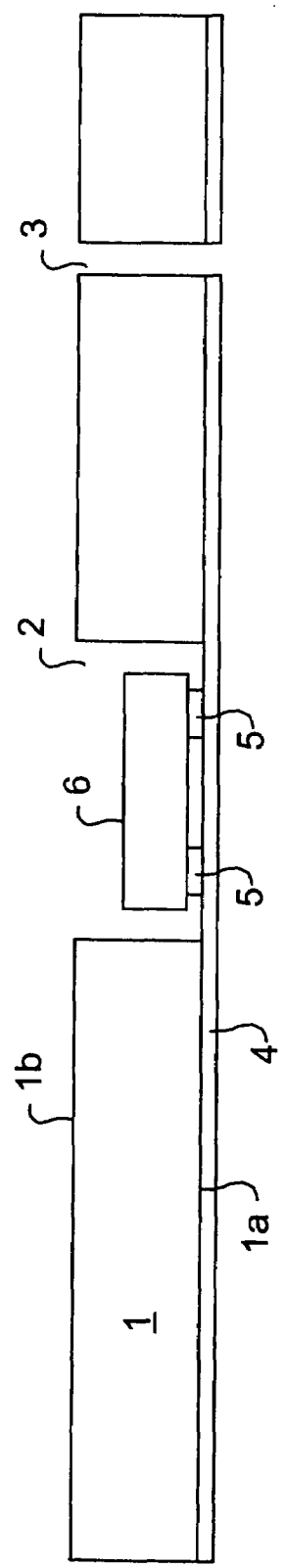

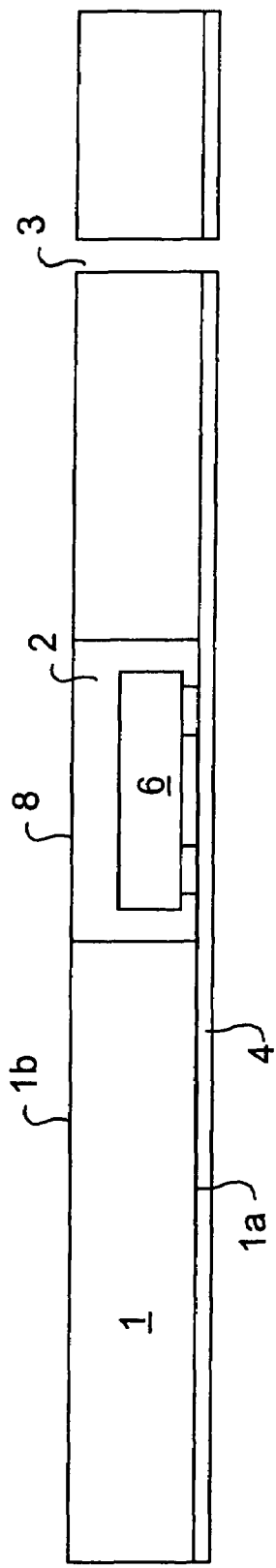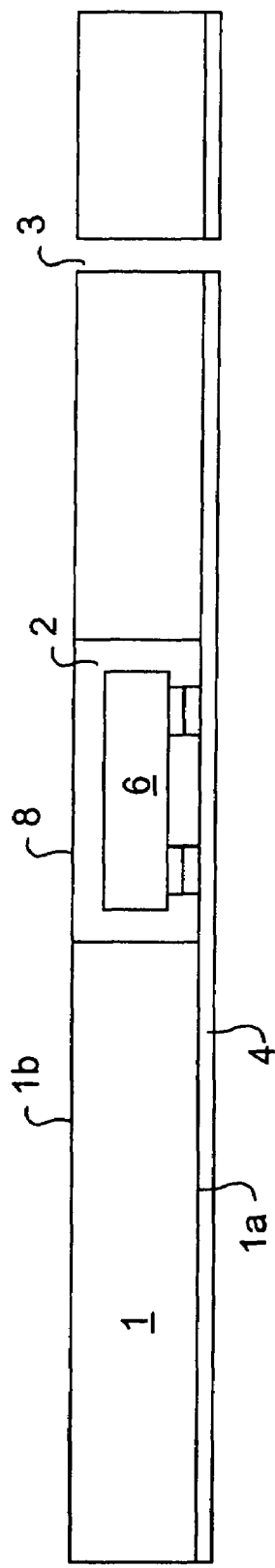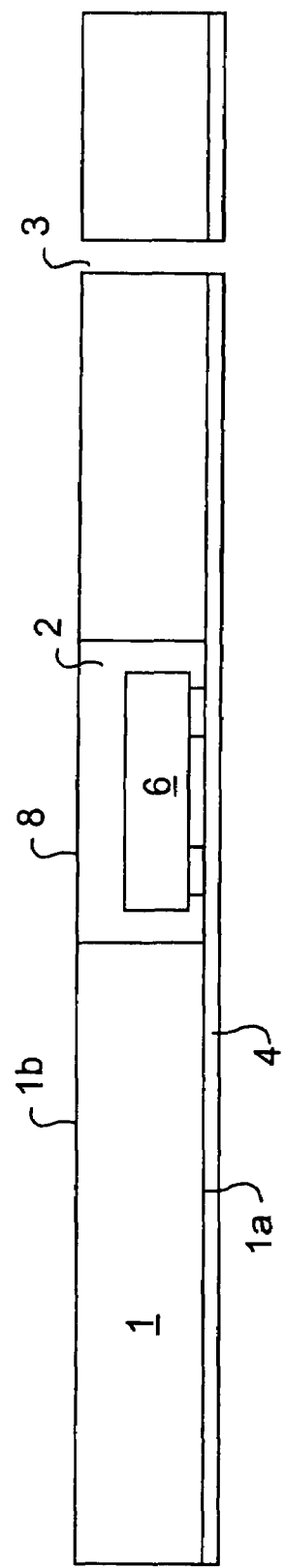

ELECTRONIC MODULE

CROSS REFERENCE TO RELATED APPLICATIONS

The present application is a Continuation of application Ser. No. 10/546,820, filed on Aug. 25, 2005 no U.S. Pat. No. 7,299,546, the entire contents of which are hereby incorporated by reference and for which priority is claimed under 35 U.S.C. §120.

BACKGROUND OF THE INVENTION

1. Field of the Invention

The present invention relates to an electronic module.

In particular, the invention relates to an electronic module, which includes one or more components embedded in an installation base. The electronic module can be a module like a circuit board, which includes several components, which are connected to each other electrically, through conducting structures manufactured in the module. The components can be passive components, microcircuits, semiconductor components, or other similar components. Components that are typically connected to a circuit board form one group of components. Another important group of components are components that are typically packaged for connection to a circuit board. The electronic modules to which the invention relates can, of course, also include other types of components.

The installation base can be of a type similar to the bases that are generally used in the electronics industry as installation bases for electrical components. The task of the base is to provide components with a mechanical attachment base and the necessary electrical connections to both components that are on the base and those that are outside the base. The installation base can be a circuit board, in which case the construction and method to which the invention relates are closely related to the manufacturing technology of circuit boards. The installation base may also be some other base, for example, a base used in the packaging of a component or components, or a base for an entire functional module.

The manufacturing techniques used for circuit boards differ from those used for microcircuits in, among other things, the fact that the installation base in microcircuit manufacturing techniques, i.e. the substrate, is of a semiconductor material, whereas the base material of an installation base for circuit boards is some form of insulating material. The manufacturing techniques for microcircuits are also typically considerably more expensive that the manufacturing techniques for circuit boards.

The constructions and manufacturing techniques for the cases and packages of components, and particularly semiconductor components differ from the construction and manufacture of circuit boards, in that component packaging is primarily intended to form a casing around the component, which will protect the component mechanically and facilitate the handling of the component. On the surface of the component, there are connector parts, typically protrusions, which allow the packaged component to be easily set in the correct position on the circuit board and the desired connections to be made to it. In addition, inside the component case, there are conductors, which connect the connector parts outside the case to connection zones on the surface of the actual component, and through which the component can be connected as desired to its surroundings.

2. Description of Background Art

However, component cases manufactured using conventional technology demand a considerable amount of space. As electronic devices have grown smaller, there has been a trend to eliminate component cases, which take up space, are not essential, and create unnecessary costs. Various constructions and methods have been developed to solve this problem.

One known solution is flip-chip (FC) technology, in which non-packaged semiconductor components are installed and connected directly to the surface of the circuit board. However, flip-chip technology has many weaknesses and difficulties. For example, the reliability of the connections can be a problem, especially in applications, in which mechanical stresses arise between the circuit board and the semiconductor component. In attempts to avoid mechanical stresses, a suitable elastic underfill, which equalizes mechanical stresses, is added between the semiconductor component and the circuit board. This procedural stage slows down the manufacturing process and increases costs. Even the thermal expansion caused by the normal operation of a device may cause mechanical stresses large enough to compromise the long-term reliability of an FC structure.

U.S. Pat. No. 4,246,595 discloses one solution, in which recesses are formed in the installation base for the components. The bottoms of the recesses are bordered by an insulation layer, in which holes are made for the connections of the component. After this, the components are embedded in the recesses with their connection zones facing the bottom of the recess, electrical contacts being formed to the components through the holes in the insulation layer. In such a method, problems can arise, for instance, when aligning the feed-throughs with the contact zones of the component. This is because the feed-throughs must be aligned relative to components lying under the insulation layer. In other ways too, the method does not correspond to the technology used nowadays (the patent dates from 1981).

JP application publication 2001-53 447 discloses a second solution, in which a recess is made for the component in the installation base. The component is placed in the recess, with the component's contact zones facing towards the surface of the installation base. Next, an insulation layer is made on the surface of the installation base and over the component. Contact openings for the component are made in the insulation layer and electrical contacts are made to the component, through the contact openings. In this method too, the alignment of the feed-throughs with the contact zones of the component can cause problems, as the alignment must be made relative to a component lying under the insulation layer. In the method, considerable accuracy is demanded in manufacturing the recess and setting the component in the recess, so that the component will be correctly positioned, to ensure the success of the feed-throughs, relative to the width and thickness of the installation board.

In general too, the connection of components through feed-throughs made in the insulation layer creates a challenge to techniques, in which an attempt is made to embed components inside a circuit board or other installation base. Problems can arise, for example, due to the alignment precision, the stress created on the surface of the component by the manufacture of the hole, and by the covering of the edge areas of the feed-through by conductive material. Even a partial reduction of the problems relating to feed-throughs would be beneficial to the low-cost manufacture of reliable electronic modules that include unpackaged components embedded in an installation base. On the other hand, embedding a component inside an installation base will allow the construction to better withstand mechanical stress, which has been a problem in flip-chip technology.

SUMMARY AND OBJECTS OF THE INVENTION

According to an aspect of the invention, there is provided an electronic module comprising a first conductive-pattern layer having contact bumps made on its first surface, a component having flat contact zones, and an insulating-material layer on the first surface of the first conductive-pattern layer, wherein the component is embedded in the insulating-material layer and the flat contact zones of the component are metallurgically and electrically connected to the contact bumps made on the first surface of the first conductive-pattern layer.

According to another aspect of the invention, there is provided an electronic module comprising a first and second conductive-pattern layers, an insulating-material layer between the first and second conductive-pattern layers, contact bumps made on the surface of the first conductive-pattern layer, and a component having flat contact zones embedded in the insulating-material layer such that the flat contact zones of the component are metallurgically and electrically connected to the contact bumps made on the surface of the first conductive-pattern layer.

According to further aspects of the invention, there are provided multi-layered electronic modules comprising a plurality of electronic modules attached on top of each other, wherein at least one of the modules of said plurality is an electronic module according to the above-mentioned aspects of the invention.

Considerable advantages are gained with the aid of embodiments of the invention. This because it is possible, with the aid of the embodiments, to embed unpackaged components in an installation base, reliably and economically.

Because the components can be embedded inside the installation base, in preferred embodiments it is possible to achieve a reliable and mechanically durable construction.

With the aid of the embodiments, it is also possible to reduce the number of the problems that appear in the prior art, which are caused by the feed-throughs relating to connecting the components. This is because in the embodiments, in which there is no need at all to make feed-throughs, the components being instead connected, already in the installation stage, to the conductor membrane, from which the conductors leading to the components of the electronic module are made.

In the embodiments, the components, of which there may be one or several, are installed on their installation base, such as a circuit board, during the manufacture of the base, so that the base structure, is as it were, manufactured around the component. The components become embedded and attached as desired to this base structure.

In the embodiments, it is thus possible to manufacture a circuit board, inside which components are embedded. There are also embodiments, with the aid of which a small and reliable component package can be manufactured around a component, as part of the circuit board. In such embodiments, the manufacturing process is simpler and cheaper that manufacturing methods in which separate cased components are installed and connected to the surface of the circuit board. The manufacturing method can also be applied to use the method to manufacture Reel-to-Reel products. Thin and cheap circuit-board products containing components can be made by using the methods according to the preferred embodiments.

There are also many other preferred embodiments, which can be used to obtain significant additional advantages. With the aid of such embodiments, a component's packaging stage, the circuit board's manufacturing stage, and the assembly and connecting stage of the components, for example, can be combined to form a single totality. The combination of the separate process stages brings significant logistical advantages and permits the manufacture of small and reliable electronic modules. A further additional advantage is that such an electronic-module manufacturing method can mostly utilize known circuit-board manufacturing and assembly technologies.

The composite process according to the embodiment referred to above is, as a totality, simpler that manufacturing a circuit board and attaching a component to the circuit board using, for example, the flip-chip technique. By using such preferred embodiments, the following advantages are obtained, compared to other manufacturing methods:

Soldering is not needed in the connections of the components, instead an electrical connection between the connection zones on the surface of the component and the metal membrane of the installation base is created, for example, by ultrasonic welding, thermo-compression, or some other such method, in which the temperatures required to achieve electrical connections, though high, are of short duration and local, and in which high temperatures are not required over a wide area. This means that the connection of a component does not need metal being maintained molten for a long time with its associated high temperature. Thus, the construction is made more reliable than soldered connections. Particularly in small connections, the brittleness of the metal alloys create large problems. In a solderless solution according to a preferred embodiment, it is possible to achieve clearly smaller constructions than in soldered solutions. The manufacturing method can even be designed so that, during the connection process of a component, heat is brought only to the area of the connection, so that the areas most strongly heated are the connection zone of the component and the area to which the component is connected. Elsewhere in the structure the temperature remains low. This gives greater freedom of choice when selecting the materials of the installation base and the components. If ultrasonic welding is used as the connection method, higher temperatures may only be required to harden the fillers used. Polymer membranes, which are hardened other than through the effect of heat, for example, chemically or with the aid of electromagnetic radiation, such as UV light, can also be used in the method. In such a preferred embodiment of the invention, the temperature of the installation base and components can be kept very low during the entire process, for example, at less than 100° C.

As smaller structures can be manufactured using the method, the components can be placed closer together. Thus, the conductors between the components also become shorter and the characteristics of the electronic circuits improve. For example, losses, interferences, and transit-time delays can be significantly reduced.

The method permits a lead-free manufacturing process, which is environmentally friendly.

When using a solderless manufacturing process, fewer undesirable intermetallics also arise, thus improving the long-term reliability of the construction.

The method also permits three-dimensional structures to be manufactured, as the installation bases and the components embedded in them can be stacked on top of each other.

There are also other preferred embodiments. For instance, flexible circuit boards can be used in connection with the embodiments. Further, in embodiments, in which the temperature of the installation base can be kept low during the entire process, organic manufacturing materials can be used comprehensively.

With the aid of the embodiments, it is also possible to manufacture extremely thin structures, in which, despite the thinness of the structure, the components are entirely protected inside their installation base, such as a circuit board.

In embodiments, in which the components are located entirely inside the installation base, the connections between the circuit board and the components will be mechanically durable and reliable.

The embodiments also permit the design of electronic-module manufacturing processes requiring relatively few process stages. Embodiments with fewer process stages correspondingly also require fewer process devices and various manufacturing methods. With the aid of such embodiments, it is also possible in many cases to cut manufacturing costs compared to more complicated processes.

The number of conductive-pattern layers of the electronic module can also be chosen according to the embodiment. For example, there can be one or two conductive-pattern layers. Additional conductive-pattern layers can be manufactured on top of these, in the manner known in the circuit-board industry. A total module can thus incorporate, for example, three, four, or five conductive-pattern layers. The very simplest embodiments have only one conductive-pattern layer and indeed one conductor layer. In some embodiments, each of the conductor layers contained in the electronic module can be exploited when forming conductive patterns.

In embodiments, in which the conductor layer connected to a component is patterned only after the connection of the component, the conductor layer can include conductor patterns even at the location of the component. A corresponding advantage can also be achieved in embodiments, in which the electronic module is equipped with a second conductive-pattern layer, which is located on the opposite surface of the base material of the module (on the opposite surface of the insulation material layer relative to the conductive-pattern layer connected to the component). The second conductor layer can thus also include conductive patterns at the location of the component. The placing of conductive patterns in the conductor layers at the location of the component will permit a more efficient use of space in the module and a denser structure.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein:

FIGS. 1-8 show a series of cross-sections of some examples of manufacturing methods by means of which it is possible to manufacture an electronic module according to an embodiment of the invention, and schematic cross-sectional diagrams of some electronic modules according to embodiments of the invention.

DETAILED DESCRIPTION OF THE PREFERRED EMBODIMENTS

Figure 3A:
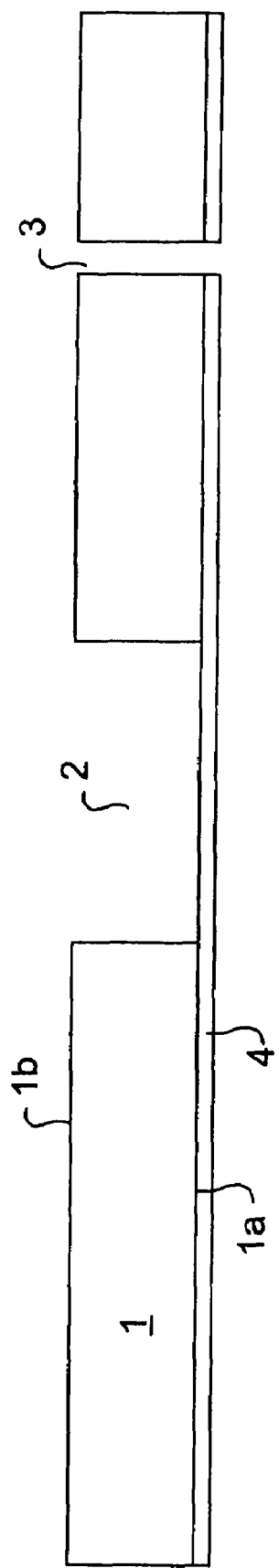
Figure 3B:
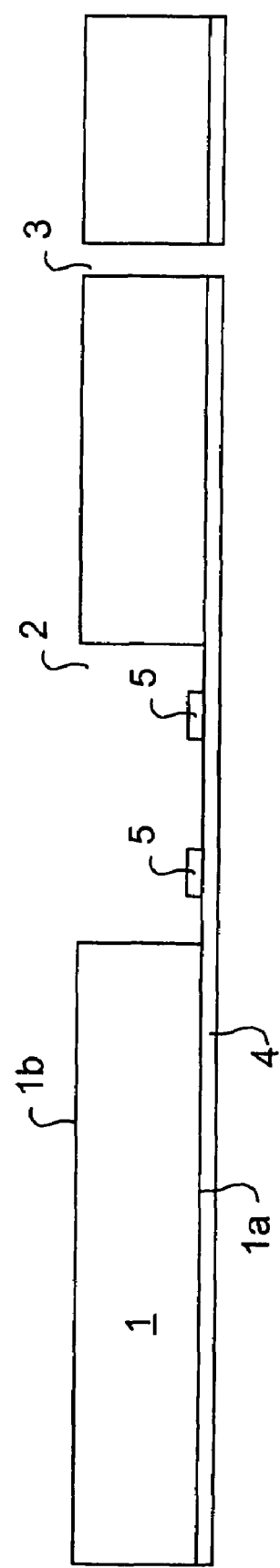

In the methods of the examples, manufacturing starts from an installation base 1 of an insulating substance, which is thicker than the components 6 that are later to be connected to the base. Of course, the method can also be applied in such a way that the installation base 1 and the component 6 are equally thick. In some embodiments, it is also possible to use components 6 that are thicker than the installation base 1. Using a suitable method, through-cavities 2, selected to suit the size of the components 6 to be installed, are made in the insulating material layer 1. The alignment of the components 6 also requires suitable alignment marks, to creation of which several different methods are available. One possible method is to make small through-holes 3 near to the installation cavities 2 of the components 6. The precise alignment of the component preferably requires at least two through-holes. An unpatterned metal film 4, which acts as the conducting surface of the installation base for the components 6 to be installed and connected, is made on the first surface 1a of the insulating substance layer 1. The metal film 4 can be manufactured, for example, by laminating copper (Cu). The metal film 4 can also be a surfaced metal film, or some other film including several layers or several materials. In some embodiments, for example, a copper film surfaced with a layer of tin or gold can be used. In these embodiments, the surfacing is typically made on the side of the insulating material layer 1. Another possible procedure is for the metal film 4 to include surfacing only in the area of the installation cavities 2.

The components 6 are aligned with their installation cavities 2 with the aid of the alignment holes 3, or some other alignment marks and the connection zones or contact protrusions 7 on the surface of the components 6 are connected to the metal film 4. The connecting can take place, for example, using the ultrasonic or thermo-compression methods.

The ultrasonic method then refers to a method, in which two pieces containing metal are pressed against each other while vibration energy at an ultrasound frequency is brought to the area of the joint. Due to the effect of the ultrasound and the pressure created between the surfaces to be joined, the pieces to be joined are bonded metallurgically. Methods and equipment for ultrasonic bonding are commercially available. Ultrasonic bonding has the advantage that a high temperature is not required to form a bond.

The terms metal layer, metal film, metal contact bump, metal contact zone, and in general a metal item, refer to the fact that the manufacturing material of the item contains enough of at least one metal for the item to form a metallurgical bond with another item. The item can naturally also include several metals as layers, accumulations, zones, or metal alloys. Possible metals include particularly copper, aluminium, gold, and tin.

The term thermo-compression method refers in turn to a method, in which two pieces containing metal are pressed against each other while thermal energy is brought to the area of the joint. The effect of the thermal energy and the pressure created between the surfaces to be joined cause the pieces to be joined to be bonded metallurgically. Methods and equipment for thermo-compression bonding are also commercially available.

In some embodiments, contact bumps 5, to which the connection zones or contact protrusions 7 of the components 6 are connected, are made on top of the conductive film 4. In such a method, the contact bumps 5 can also be used to align the components 6 during the components' installation stage. The components 6 can, of course, be aligned with the aid of other alignment marks, for example, the alignment holes 3, if such are made in the process being used. In embodiments using contact bumps 5, the procedure can otherwise correspond to embodiments in which contact bumps 5 are not used. The use of contact bumps 5 is justified, for example, if the material of the components' 6 contact zones or contact protrusions 7 is not directly suitable for connection to the selected material of the conducting layer 4. In that case, the material of the contact bumps 5 is selected to permit a bond using the bumps 5 to be created. In such embodiments, the contact bumps 5 are thus intended to match two different conductor materials to each other. For this purpose, the contact bump 5 can also be manufactured as a layered structure, containing two or more layers of possibly differing materials.

After the connection of the components 6, the space remaining in the installation cavity 2 around the component 6 is filled with a suitable filler 8, usually some kind of polymer filler. The filling is intended to secure the component 6 mechanically to the insulating material layer 1, thus achieving a mechanically more durable construction. The filler material 8 also supports the conductive patterns 14 to be formed later from the conducting layer 4 and protects the component and the bond between the component 6 and the conducting layer 4 during the formation of the conductive patterns 14. In principle, the securing of the component 6 is not, however, an essential operation, especially in embodiments, in which mechanical durability or a long life are not demanded of the structure.

If desired, a conductive film 9, from which conductive patterns 19 can be formed later, can also be made on the second surface 1b of the insulating material layer 1. The conductive film 9 can be manufactured in a manner corresponding to that of the conductive film 4 made of the first surface 1a of the base. The manufacture of a second conductive film 9 is not, however, necessary in simple embodiments and when manufacturing simple electronic modules. A second conductive film 9 can, however, be exploited in many ways, such as additional space for conductive patterns and to protect the components 6 and the entire module against electromagnetic radiation (EMC shielding). With the aid of a second conductive film 9 the structure can be reinforced and warping of the installation base, for example, can be reduced.

The manufacturing processes according to the examples can be implemented using manufacturing methods, which are generally known to those versed in the art of manufacturing circuit boards.

In the following, the stages of the method shown in FIGS. 1-8 are examined in greater detail.

Stage A (FIG. 1):

In stage A, a suitable sheet 1 of insulating-material board, from which the body of the installation base is formed, is selected for the manufacturing process of the electronic module. The insulating-material layer 1 should preferably be thicker than the component to be installed. The component can then be embedded entirely inside the installation base while the electronic module will be even on both surfaces. Of course, thicker special components can also be embedded into the installation base, their rear surface protruding outside the second surface 1b of the insulating-material layer 1. This can be done particularly if it is not intended to stack a second electronic module on top of the electronic module being manufactured. In terms of the durability of the construction, however, it would be preferable for the components to be embedded entirely inside the installation base.

The insulating-material layer 1 can be, for example, a polymer base, such as a glass-fibre reinforced epoxy sheet FR4. In embodiments in which high temperatures are not needed in the manufacturing process, the installation base 1 can also be a cheap and flexible organic sheet. Other examples of suitable materials for the insulating-material layer 1 are PI (polyimide), FR5, aramide, polytetrafluoroethylene, Teflon®, and LCP (liquid crystal polymer).

Stage B (FIG. 2):

In stage B, through-cavities 2 of a suitable size and shape for the components to be embedded in the sheet are made in the insulating-material layer 1. The cavities 2 can be made suitably, for example, using some known method used in circuit-board manufacture. The cavities 2 can be made, for example, mechanically by milling, impact, drilling, or with the aid of a laser. The cavities 2 extend through the entire insulating-material layer 1, from its first surface 1a to its second surface 1b. If several of the cavities 2 are made, they are positioned relative to each other within the highest limits of accuracy possible for the manufacturing method being used.

Stage C (FIGS. 3A and 3B):

The example series of figures shows two alternative stage Cs. According to a modification of the example process A (FIG. 3A), in stage C a thin conductive film 4, or more generally a conducting layer 4 is attached to the second surface 1b of the insulating-material layer 1. The conductive film 4 is typically a metal film 4. In several embodiments, a suitable metal film is a copper (Cu) film, though other metals and also metal alloys can very well be used. The copper film can be attached to the insulating-material layer 1, for example, by lamination. An adhesive layer, which is spread on the surface of the insulating-material layer 1 or of the conductive film 4 prior to laminating the conductive film 4, can be used to aid the attachment of the conductive film 4. In the example processes, patterns have not yet been made in the conductive film 4 at this stage, so that there is no need to particularly align the film 4 relative to the insulating-material layer 1. During, or after the attaching of the conductive film 4, through-holes 3, which can be used later to align the components in the component installation stage, can also be made in the installation base. However, it is not essential to make through-holes 3, as instead other suitable alignment marks can be used to align the components. If through-holes 3 are made, it would be best for there to be at least two of them in the installation base. It is also possible to proceed so that two through-holes 3 are made for each component to be installed. In the embodiment shown in the figures, the through-holes 3 used to align the components extend through both the insulating-material layer 1 and the conductive film 4. This has the advantage that the same alignment marks (the through-holes 3) can be used for alignment on both sides of the installation base.

In stage C of the B modification of the example process (FIG. 3B), the procedure is mainly the same as is the A modification, except that, in addition to the stages shown in the A modification, in the B modification contact bumps 5 are made on the surface of the conductive film 4. The contact bumps 5 can be made in the conductive film 4 prior to the attachment of the conductive film 4 to the insulating material layer 1. The contact bumps 5 are then aligned relative to each other, while in the attachment stage of the conductive film 4 the conductive film 4, together with the contact bumps 5, is aligned relative to the insulating-material layer 1 and particularly to the installation cavities 2 made in the insulating-material layer 1. A second alternative is to first attach the conductive film 4 to the insulating-material layer 1 and after this make the contact bumps 5 on the bottom of the installation cavities 2. The contact bumps 5 are intended to connect a component to be installed later to the conductive film 4. In the example process, the contact bumps 5 are manufactured from some metallurgically compatible material, such as gold (Au). The contact bumps can be made using some process generally known in the circuit-board industry. If through-holes 3 are used in the process for alignment, they can be made in the same stage. The through-holes 3 can also be made after making the contact bumps 5, in which case they should be aligned as accurately as possible relative to the contact bumps 5, or else prior to manufacturing the contact bumps 5, in which case the contact bumps 5 are aligned relative to the through-holes 3.

Stage D (FIGS. 4A, 4B, and 4C):

Three modifications of Stage D are shown. In the A modification (FIG. 4A), a component 6, which includes contact bumps 7 in the connection zones of the component, is connected to the installation base. The contact bumps 7 of the component are connected to the conductive layer 4, so that an electrical contact is formed between the contact bump 7 and the conductive layer 4. It would be good for the connection to also withstand mechanical stress, so that the connection will not be easily broken in later process stages, or during the operation of the electronic module. The connection is formed using a suitable connection method, for example, the ultrasonic and thermo-compression methods. In the connection stage, the through-holes 3 made for alignment, or other available alignment marks are used to align the component 6.

In the B modification (FIG. 4B) too, a component 6, which includes contact bumps 7 in the connection zones of the component, is connected to the installation base. The difference to the A modification is that, in the B modification, contact bumps 5 are also formed on top of the conductive layer 4. The contact bumps 7 of the component are then connected to the contact bumps 5 of the installation base. The connection can, as in modification A, be formed using a suitable connection method, for example, the ultrasonic or thermo-compression methods. In the B modification, the component can be aligned, according to the embodiment, using the contact bumps 5, the through-holes 3, or other alignment marks suitable for alignment.

In the C modification of the example process, as in the B modification, an installation base is used, in which contact bumps 5 are made on top of the conductor layer 4. Unlike in the A and B modifications, in the C modification a component 6 is used, the surface of which has flat contact zones, but no actual contact bumps 7, or other corresponding contact protrusions. In the C modification, connection and alignment are carried out as in the B modification, except that the connection is formed between the conductive material of the contact zones and the contact bumps 5 of the installation base.

Stage E (FIGS. 5A, 5B, and 5C):

In stage E, the space remaining between the component 6 and the installation base is completely filled with a filler 8, which is, for example, some suitable polymer. For example, epoxy filled with suitable particles can be used as the polymer. The polymer can be spread using, for example, some known vacuum-paste-pressing device suitable for the task. FIGS. 5A, 5B, and 5C show the installation base after the attachment of a component, in A, B, and correspondingly C modifications of the process. The purpose of the filler 8 is to secure the component 6 mechanically to the insulating-material layer 1, so that the electronic module will better withstand mechanical stress. In addition, the filler 8 protects the component 6 during later process stages. Protecting the component 6 can be particularly beneficial in embodiments, in which conductive patterns are formed by etching the conductive layer 4 and in which the surface of the component 6 is sensitive to the effect of the etching agent used. Otherwise, the filling of the installation cavity 2 is in no way essential and, at least in some embodiments, stage E can be omitted or performed at a later stage in the process.

In some embodiments, the installation cavity 2 can be dimensioned to the size of the component 6, so that a friction fit is created between the component and the installation cavity 2, filler 8 then not being necessarily required. Such an embodiment is, however more challenging in terms of the manufacturing technology while the final result remains mechanically weaker than in the embodiments shown in FIGS. 5A, 5B, and 5C.

In embodiments, in which conductive patterns are formed on the second surface 1b of the insulating layer 1, the manufacture of the conductive patterns can be facilitated by evening the second surface 1b of the insulating layer 1, with the aid of a filler 8.

Figure 6A:
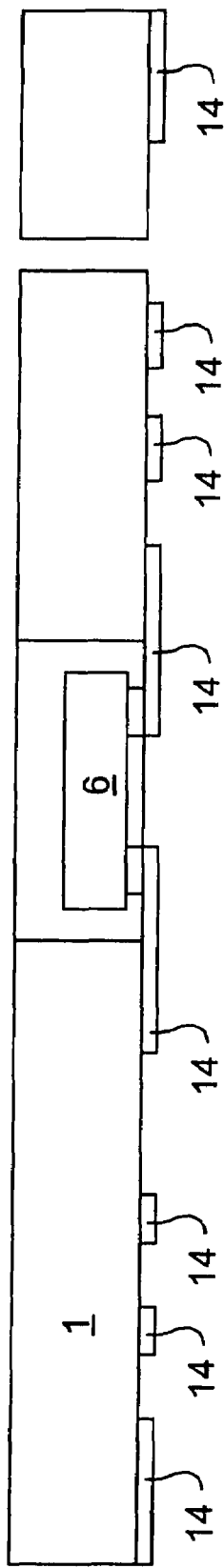
Figure 6B:
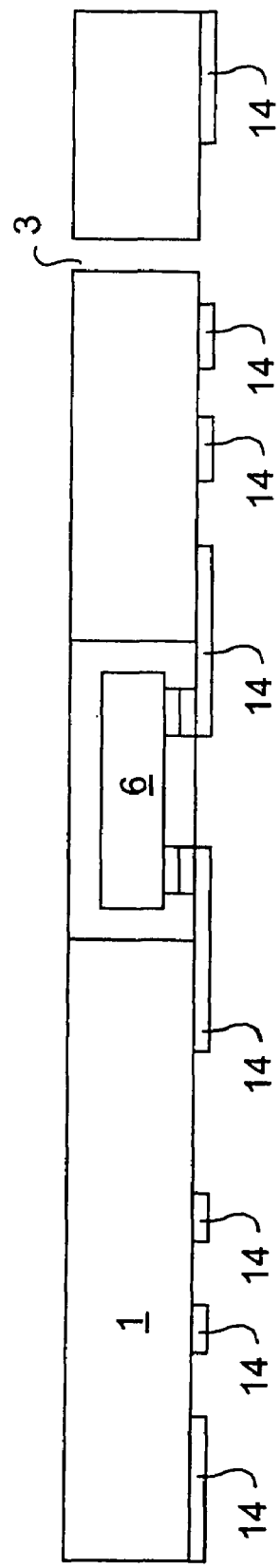
Figure 6C:
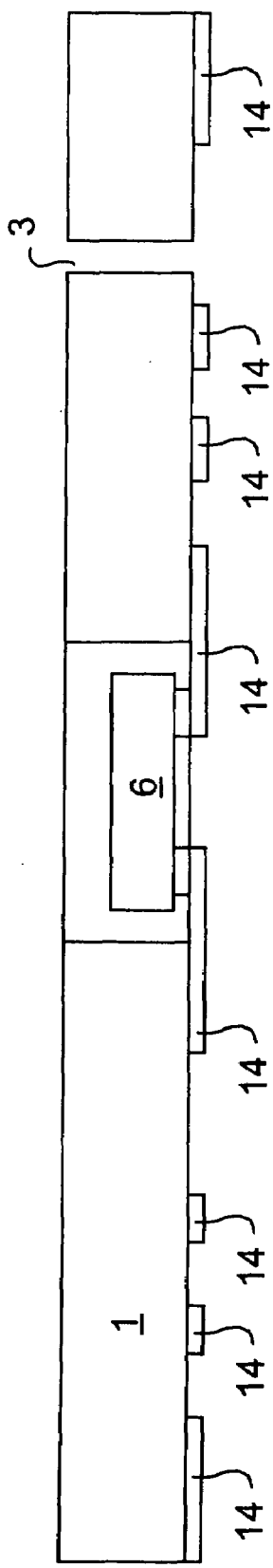

Stage F (FIGS. 6A, 6B, and 6C):

FIGS. 6A, 6B, and 6C show the electronic module after the carrying out of stage F, in modifications A, B, and C of the process, respectively. Stage F itself is, however, performed in the same way in each of these modifications. In stage F, conductive patterns 14 are formed from the conductive layer 4 using some suitable method. The conductive patterns 14 can be made, for instance, by removing the conductive material of the conductive layer 4 from outside of the conductive patterns. The conductive material can be removed, for example, using one of the selective etching methods that are widely used and well known in the circuit-board industry. If the conductive layer 4 is made from a special material, the conductive patterns 14 can also formed in such a way that the conductivity of the conductive material 4 is removed from outside of the conductive patterns, for example, with the aid of electromagnetic radiation. When using a conversely reactive material, the material is put into a conductive state in the area of the conductive patterns. Thus, the conductive layer 4 is, in the previous stages of the method, actually the insulating layer, which can be converted to be conductive with the aid of special treatment. The manner of forming the conductive patterns 14 is thus not, as such, essential to the manufacture of the electronic module.

The conductive patterns are aligned with the aid of alignment marks made in the installation base. The alignment marks can be the same that are used to align the components, or else separate alignment marks, which are made at a specific location relative to the alignment marks used in the alignment of the components. Because the components and conductive patterns are both aligned relative to the alignment marks on the installation base, they are thus also aligned relative to each other.

If through-holes 3 are made in the embodiment, the conductive patterns to be made can be aligned with the aid of the through-holes 3.

After stage F, the electronic module includes a component 6, or several components 6 and conductive patterns 14, with the aid of which the component or components 6 can be connected to an external circuit, or to each other. The conditions for manufacturing a functional totality then exist already. The process can thus be designed in such a way that the electronic module is already finished after stage F and FIGS. 6A, 6B, and 6C show examples of some possible electronic modules that can be manufactured using the example methods. Of course, if it is wished, the process can also continue after stage F, for example, by making conductive patterns on the second surface 1b of the insulating layer 1, or by surfacing the electronic module with a protective substance.

Figure 7A:
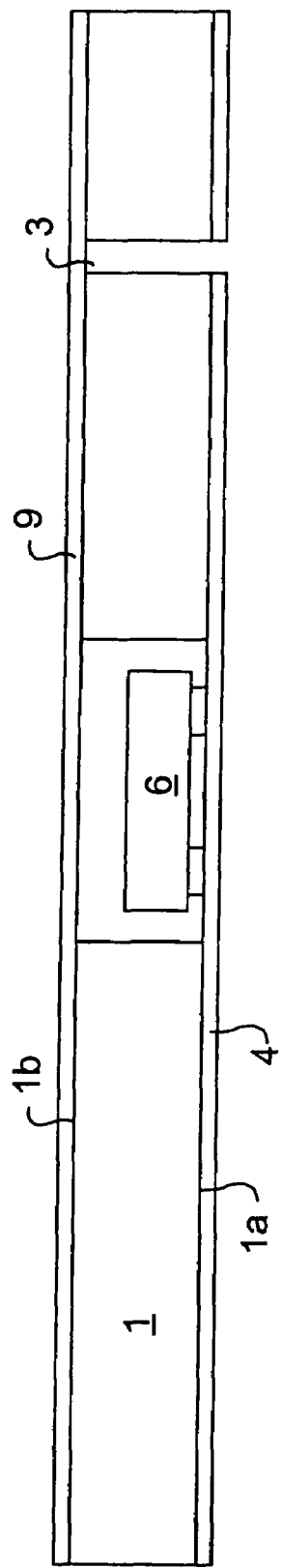
Figure 7B:
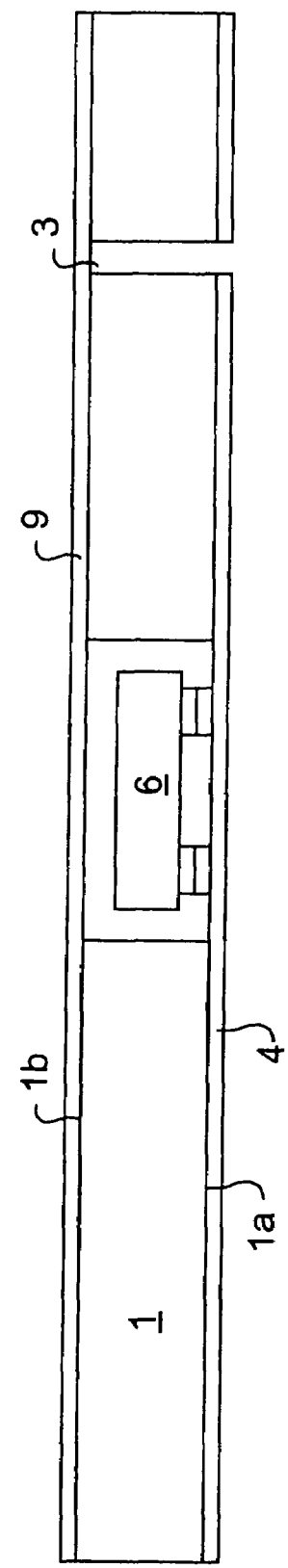
Figure 7C:
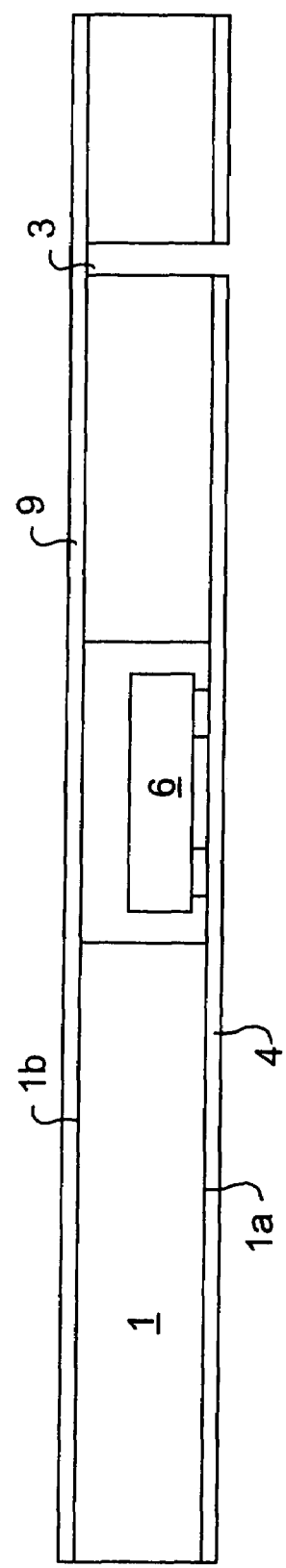

Stage G (FIGS. 7A, 7B, and 7C):

FIGS. 7A, 7B, and 7C show embodiments of the manufacturing process as A, B, and C modifications, in which, after stage E, a conductive layer 9 is formed on the second surface 1b of the insulating layer 1. In the embodiments shown in FIGS. 7A, 7B, and 7C, stage F is thus omitted, the method moving to stage G directly from stage E.

Stage G corresponds to stage C, in which a conductive layer 4 is made on the first surface 1a of the insulating layer 1. As in stage C, the conductive layer 9 can be made, for example, by laminating, on the second surface 1b of the insulating layer 1, a type of electrically-conductive film 9 corresponding to the one on the first surface 1a. The lamination can exploit an adhesive spread on the surface of the base or film, and which during the lamination stage attaches the installation base and the electrically-conductive film to each other.

Figure 8A:
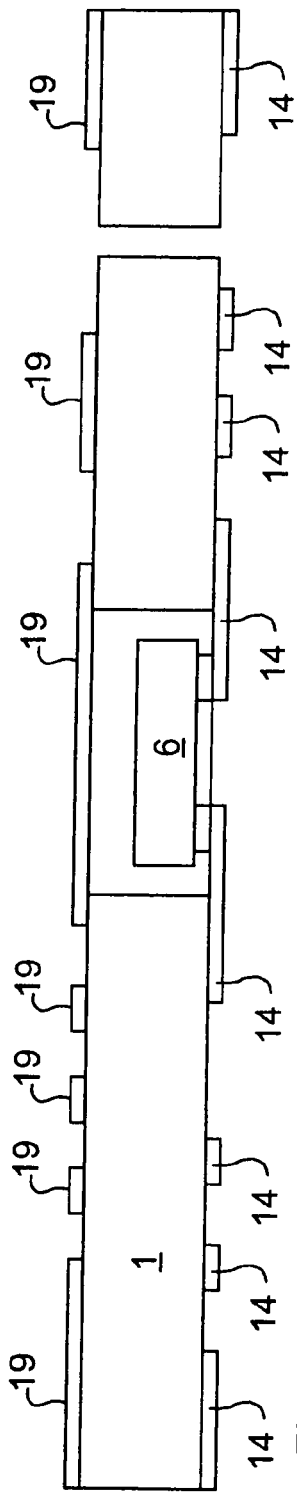
Figure 8B:
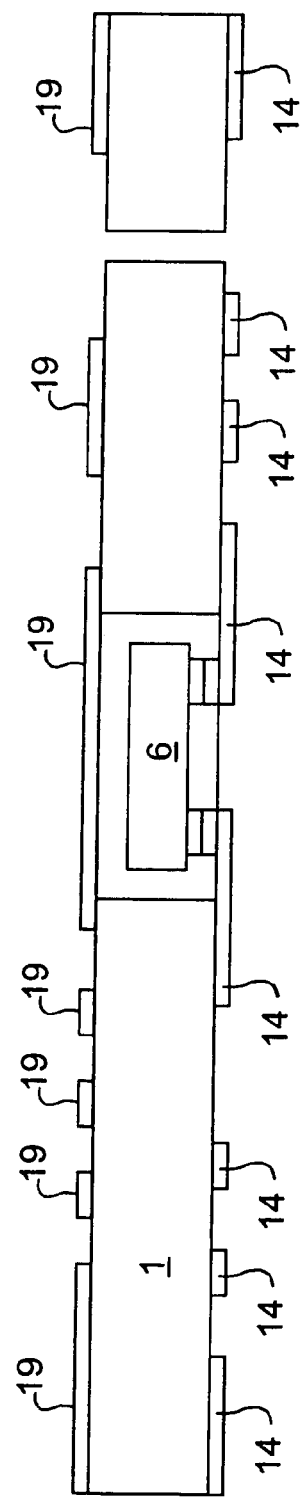
Figure 8C:
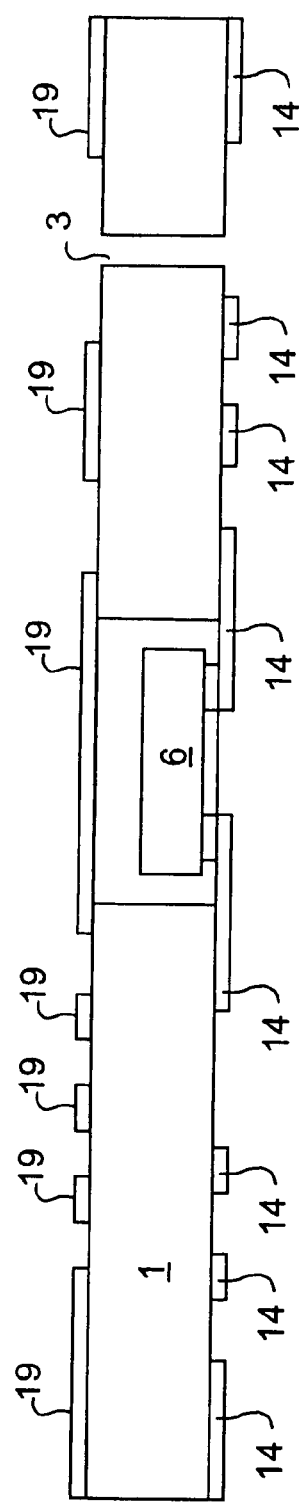

Stage H (FIGS. 8A, 8B, and 8C):

Stage H can be carried out after stage G, if it is wished to pattern the conductive layer 9 formed on the second surface 1b of the insulating layer 1. Stage H corresponds to stage F, with the difference that, in stage H, in addition to the conductive patterns 14, other conductive patterns 19 are formed from the conductive layer 9 made on the second surface 1b of the insulating layer 1. After carrying out stage H, the electronic module will include conductive patterns on both surfaces of the insulating-material layer 1. The second conductive-pattern layer will provide more diverse connection possibilities between the components 6. FIGS. 8A, 8B, and 8C show the electronic module after the carrying out of stage H, respectively in A, B, and C modifications of the process. Stage F itself is, however, carried out in the same way in each of these modifications.

After stage H, the electronic module includes a component 6, or several components 6 and conductive patterns 14 and 19. The examples of FIGS. 8A, 8B, and 8C show some possible electronic modules that can be manufactured using the example methods. If desired, the process can continue after stage H, for example, by making a feed-through, or feed-throughs, with the aid of which suitable points in the conductive pattern 14 can be connected electrically to suitable parts of the conductive pattern 19. The electronic module can also be surfaced with a protective substance.

FIG. 9

Figure 9:
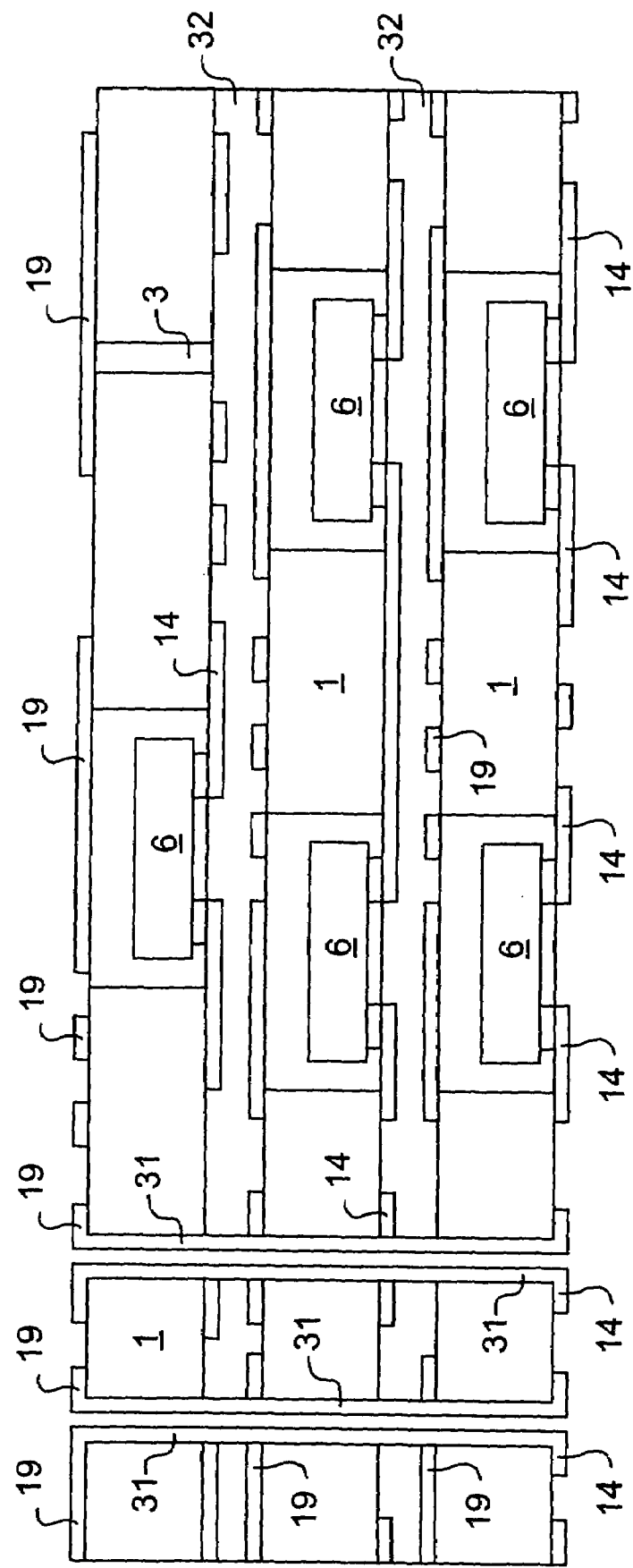
FIG. 9 shows a cross-sectional view of an electronic module according to an embodiment of the invention, which includes several installation bases on top of each other.

FIG. 9 shows a multi-layered electronic module, which includes three installation bases 1 laminated on top of each other, together with their components 6, and a total of six conductive-pattern layers 14 and 19. The installation bases 1 are attached to each other with the aid of intermediate layers 32. The intermediate layer 32 can be, for example, a pre-preg epoxy layer, which is laminated between the installation bases 1. After this, holes running through the module are drilled in the electronic module, in order to form contacts. The contacts are formed with the aid of a conductive layer 31 grown in the holes. With the aid of the conducts 31 running through the electronic module, the various conductive-pattern layers 14 and 19 of the installation bases 1 can be suitably connected to each other, thus forming a multi-layered functioning totality.

On the basis of the example of FIG. 9, it is clear that the method can also be used to manufacture many different kinds of three-dimensional circuit structures. The method can be used, for example, in such a way that several memory circuits are placed on top of each other, thus forming a package containing several memory circuits, in which the memory circuits are connected to each other to form a single functional totality. Such packages can be termed three-dimensional multichip modules. In modules of this kind, the chips can be selected freely and the contacts between the various chips can be easily manufactured according to the selected circuits.

The sub-modules (installation bases 1 with their components 6 and conductors 14 and 19) of a multi-layered electronic module can be manufactured, for example, using one of the electronic-module manufacturing methods described above. Some of the sub-modules to be connection to the layered construction can, of course, be quite as easily manufactured using some other method suitable for the purpose.

The examples of FIGS. 1-9 show some possible processes, with the aid of which embodiments of our invention can be exploited. Our invention is not, however, restricted to only the processes disclosed above, but instead the invention also encompasses various other processes and their end products, taking into account the full scope of the claims and the interpretation of their equivalences. The invention is also not restricted to only the constructions and methods described by the examples, instead it is obvious to one versed in the art that various applications of our invention can be used to manufacture a wide range of different electronic modules and circuit boards differing greatly from the examples described above. Thus, the components and wiring of the figures are shown only with the intention of illustrating the manufacturing process. Thus, many alterations to and deviations from the processes of the examples shown above can be made, while nevertheless remaining within the basic idea according to the invention. The alterations can relate, for example, to the manufacturing techniques described in the different stages, or to the mutual sequence of the process stages.

With the aid of the method, it is also possible to manufacture component packages for connection to a circuit board. Such packages can also include several components that are connected electrically to each other.

The method can also be used to manufacture total electrical modules. The module can also be a circuit board, to the outer surface of which components can be attached, in the same way as to a conventional circuit board.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. An electronic module, comprising:
    a first conductive-pattern layer having a first surface,
    first solid contact bumps solderlessly made on the first surface of the first conductive-pattern layer and metallurgically and electrically connected thereto,
    a component having flat contact zones,
    second solid contact bumps solderlessly made on the flat contact zones and metallurgically and electrically connected thereto, and
    an insulating-material layer on the first surface of the first conductive-pattern layer,
wherein the component is embedded in the insulating-material layer and wherein the second solid contact bumps made on the flat contact zones of the component are metallurgically, electrically and solderlessly connected to the first solid contact bumps made on the first surface of the first conductive-pattern layer.

2. The electronic module of claim 1, wherein the insulating-material layer comprises a first surface and a second surface, the first surface being against the first conductive-pattern layer, and the electronic module comprises a second conductive-pattern layer on the second surface of the insulating-material layer.

3. The electronic module of claim 1, wherein the first solid contact bumps include a layered structure, containing at least two layers of at least two different materials.

4. The electronic module of claim 1, wherein the component is a microcircuit.

5. The electronic module of claim 1, wherein the component is entirely protected inside the insulating-material layer.

6. The electronic module of claim 1, wherein the insulating-material layer comprises a first surface and a second surface, the first surface being against the first conductive-pattern layer, and the electronic module comprises a conductive film on the second surface of the insulating-material layer for protecting the component against electromagnetic radiation.

7. The electronic module of claim 1, comprising a plurality of components having flat contact zones metallurgically and electrically connected to the first solid contact bumps made on the first surface of the first conductive-pattern layer by means of said second solid contact bumps.

8. The electronic module of claim 7, wherein the plurality of components are electrically connected to each other by means of the first conductive-pattern layer.

9. The electronic module of claim 1, wherein the insulating-material layer is a glass-fiber reinforced epoxy sheet.

10. The electronic module of claim 1, wherein the insulating-material layer is a flexible organic sheet.

11. The electronic module of claim 1 wherein the metallurgically electrical connection are ultrasonic or thermo-compression connections.

12. The electronic module of claim 11 wherein the metallurgically electrical connections are facilitated by the presence of one or more metals selected from the group consisting of copper, aluminum, gold and tin.

13. An electronic module, comprising:
a first conductive-pattern layer having a first surface,
a second conductive-pattern layer having a second surface,
an insulating-material layer between the first surface of the first conductive-pattern layer and the second surface of the second conductive-pattern layer,
first solderless contact bumps made on the first surface of the first conductive-pattern layer and metallurgically and electrically connected thereto,
a component having flat contact zones embedded in the insulating-material layer,
second solderless contact bumps made on the flat contact zones and metallurgically and electrical connected thereto, and
wherein the flat contact zones of the component are metallurgically, electrically and solderlessly connected to the first solderless contact bumps made on the first surface of the first conductive-pattern layer by means of the second solderless contact bumps made on said flat contact zones.

14. The electronic module of claim 13, wherein the first solderless contact bumps include a layered structure, containing at least two layers of at least two different materials.

15. The electronic module of claim 14, wherein the component is a microcircuit.

16. The electronic module of claim 13, wherein the second conductive-pattern layer is configured to protect the component against electromagnetic radiation.

17. The electronic module of claim 13, comprising a plurality of components having flat contact zones and second solderless contact bumps made on the flat contact zones, the flat contact zones being metallurgically and electrically connected to the first contact bumps made on the first surface of the first conductive-pattern layer by means of said second solderless contact bumps.

18. The electronic module of claim 17, wherein the plurality of components includes at least one microcircuit, and the plurality of components are electrically connected to each other by means of the first conductive-pattern layer.

19. A multi-layered electronic module, comprising a plurality of electronic modules attached on top of each other, wherein at least one of the modules of said plurality comprises:
a first conductive-pattern layer having a first surface,
first solderless contact bumps made on the first surface of the first conductive-pattern layer,
an insulating-material layer on the first surface of the first conductive-pattern layer, and
a component embedded in the insulating-material layer and having flat contact zones,
second solderless contact bumps made on the flat contact zones of the component, wherein, the flat contact zones of the component are metallurgically and electrically connected to the first conductive-pattern layer via the first solderless contact bumps made on the first surface of the first conductive-pattern layer and the second solderless contact bumps made on the flat contact zones of the component.

20. The multi-layered electronic module according to the claim 19, comprising a plurality of memory circuits.

21. The multi-layered electronic module according to claim 19, wherein the electronic modules are electrically connected to each other in order to form a multilayered functioning totality.

22. A multi-layered electronic module, comprising a plurality of electronic modules attached on top of each other, wherein each of said plurality of electronic modules comprises:
a first conductive-pattern layer having a first surface,
first solderless contact bumps made on the first surface of the first conductive-pattern layer,
an insulating material layer on the first surface of the first conductive-pattern layer, and
a component embedded in the insulating-material layer, the component having flat contact zones,
second solderless contact bumps made on the flat contact zones of the component, and
wherein the flat contact zones of the component are metallurgically, electrically and solderlessly connected to the first conductive-pattern layer by means of the second solderless contact bumps made on the flat contact zones and the first solderless contact bumps made on the first surface of the first conductive-pattern layer.

23. The multi-layered electronic module according to claim 22, comprising a plurality of memory circuits.

24. The multi-layered electronic module according to claim 22, wherein the electronic modules are electrically connected to each other in order to form a multi-layered functioning totality.

25. A multi-layered electronic module, comprising a plurality of electronic modules attached on top of each other, wherein at least one of the modules of said plurality comprises:
- a first conductive-pattern layer having a first surface,
- a second conductive-pattern layer having a second surface,
- an insulating-material layer between the first surface of the first conductive-pattern layer and the second surface of the second conductive-pattern layer,
- first solid contact bumps solderlessly made on the first surface of the first conductive-pattern layer and metallurgically and electrically connected thereto,
- a component having flat contact zones embedded in the insulating-material layer,
- second solid contact bump solderlessly made on the flat contact zones and metallurgically and electrically connected thereto, and
- wherein the first solid contact bumps such that the flat contact zones of the component are metallurgically and electrically connected to the first conductive pattern layer via respective first and second solid contact bumps.

26. The multi-layered electronic module according to claim 25, comprising a plurality of memory circuits.

27. The multi-layered electronic module according to claim 25, wherein the electronic modules are electrically connected to each other in order to form a multi-layered functioning totality.

* * * * *